United States Patent [19]

Casper et al.

[11] 4,307,469
[45] Dec. 22, 1981

[54] INJECTION LASER DIODE DIGITAL TRANSMITTER HAVING SIGNAL QUALITY MONITORING ARRANGEMENT

[75] Inventors: Paul W. Casper, Melbourne, Fla.; William B. Ashley, Manhattan Beach, Calif.

[73] Assignee: Harris Corporation, Melbourne, Fla.

[21] Appl. No.: 141,590

[22] Filed: Apr. 18, 1980

[51] Int. Cl.³ .............................................. H04B 9/00
[52] U.S. Cl. .................... 455/613; 455/608; 455/609; 455/618
[58] Field of Search ............... 455/609, 610, 613, 618, 455/608

[56] References Cited

U.S. PATENT DOCUMENTS

| | | | |
|---|---|---|---|
| 3,943,358 | 3/1976 | Reymond | 455/613 |
| 4,019,048 | 4/1977 | Maione | 455/609 |
| 4,070,572 | 1/1978 | Summerhayes | 455/613 |
| 4,149,071 | 4/1979 | Nagai | 455/613 |
| 4,211,929 | 7/1980 | Tamburelli | 455/618 |

*Primary Examiner*—Howard Britton
*Attorney, Agent, or Firm*—Craig and Antonelli

[57] ABSTRACT

An injection laser diode transmitter for a fiber optic link contains a detector that monitors transmitted optical pulses for signal quality. The transmitted signal component is extracted from the back facet of the ILD for feedback stability control and is coupled to signal quality measuring circuitry from a wideband current-to-voltage converter that is coupled to the output of a fast photo diode that extracts the optical output signal from the rear facet of the ILD for the purposes of generating a feedback control voltage to be used for ILD bias control. The bias current feeds a reference amplifier, the output of which is coupled to a lowpass filter to remove the pulse signal component. The output of the lowpass filter is a DC voltage level which is proportional to the average optical output of the ILD. The voltage level output of the lowpass filter is applied to a current sink coupled to the ILD. The bias current for the ILD is controlled to drive the differential to zero. Because the bias current control feedback loop is responsive to the optical output of the ILD, the bias current is automatically compensated for changes in temperature.

The current-to-voltage converter output is further coupled to a buffer amplifier to supply an output voltage to downlink signal quality monitoring circuitry to facilitate fault isolation.

30 Claims, 2 Drawing Figures

INJECTION LASER DIODE DIGITAL TRANSMITTER HAVING SIGNAL QUALITY MONITORING ARRANGEMENT

FIELD OF THE INVENTION

The present invention relates to communication systems and is particularly directed to an electro-optic transmitter configuration in which the operation of the optical signal transmitting component, an injection laser diode, is controlled by an arrangement that monitors optical pulses produced from the rear facet of the diode. From this monitoring arrangement the transmitted pulses are examined for degradation and error detection in the output signal in order to provide a signal evaluation output that is used to isolate failures along a communication link in which the electro-optic transmitter is employed.

BACKGROUND OF THE INVENTION

The recent development and practical implementations of high data rate fiber optic communication systems for carrying multi-megabit/sec. digital data, such as high density multiplexed fiber optic telephone trunking systems, have included refinements in the field of optic signal transmission components, such as optical regenerator circuitry and electro-optic transmitter devices. A common requirement in these systems is the stability of the optical pulse transmitter components, typically injection laser diodes (ILDs) which are turned on and off at very high data rates to generate the required optical representations of the electrical signal inputs to be conveyed over a fiber optic highway to a repeater (regenerator) or receiver station.

Usually, data to be transmitted is applied to an ILD with a feedback control circuit sensing the optical output power and generating a control signal in an effort to maintain the average optical output power constant. An injection laser diode transmitter configuration illustrative of this type of device is described in the U.S. patent to Maione et al U.S. Pat. No. 4,019,048 and on pages 1824-1828 of the Bell System Technical Journal, July-August, 1978. Through a prebias feedback control arrangement, fluctuations of the laser optical output caused by temperature variations or aging result in a corresponding change in photo-current produced by a relatively slow optical output-monitoring photo diode. This photo-current represents an average of the peak laser diode output integrated over the time constant of the photo diode and therefore provides a slowly variable DC control level for compensating for any drifting of the optical output of the laser diode due to temperature and aging.

In copending application Ser. No. 149,291, filed May 12, 1980, by P. Casper et al, entitled MultiChannel, Repeatered, Fiber optic Communication Network and assigned to the assignee of the present application, there is described a system for monitoring the quality of signals transmitted over the fiber optic communication links and isolating the location of a fault of source of signal degradation along one of the fiber optic links. Advantageously, the system described in the above-referenced application employs an electro-optic transmitter according to the present invention which provides an extremely accurate and simple technique for monitoring the signal quality along a fiber optic link, while, at the same time, providing the stability required to offset the effects of temperature fluctuations and aging.

SUMMARY OF THE INVENTION

For this purpose, the present invention uses a detector arrangement that monitors the quality of the signal transmitted over a fiber optic link of interest by examining the transmitted optical pulses for degradation and error detection. The transmitted signal component that is extracted from the rear facet of the ILD for feedback stability control purposes is also derived from a readily accessible point in the ILD bias control feedback path and forwarded to signal quality monitoring circuitry from which an indication of signal quality may be obtained. This function is achieved by coupling the signal quality measuring circuitry to a wideband current-to-voltage converter that is coupled to the output of a fast photo diode. This photo diode extracts the optical output signal from the rear facet of the ILD for the purposes of generating a feedback control voltage to be used for ILD bias control.

Unlike the prior art feedback configuration, such as that described in the above-mentioned patent and publication, the feedback control circuitry of the present invention employs a fast photo diode the output photo current of which effectively follows the rapid excursions in the high data rate optical pulses emitted by the ILD. The data signal-representative photo-current is converted to a data signal voltage by a wide band current-to-voltage converter (resistor), buffered, and coupled to signal quality monitoring circuitry. For feedback control purposes, the signal voltage output of the resistor is coupled through a reference amplifier or comparator to a low pass filter in order to remove the signal component and obtain a DC voltage level representative of average optical output. This DC voltage is coupled to a bias current sink to adjust the bias on the ILD to compensate for instability influences. This manner of deriving a signal quality-representative signal is particularly useful where fault isolation is conducted from a remote terminal, from which direct observation of the output optical signal of each regenerator or transmitter is not afforded. In addition, pursuant to the present invention, stable operation without ILD degradation over a very wide temperature range is obtained by thermoelectric cooling of the ILD, so that a range of operation from −50° to +70° C. can be achieved.

In a practical embodiment of the invention, a bias feedback control configuration somewhat similar to that used in the above-cited patent and publication is employed. The input signal to be transmitted is coupled to an injection laser diode circuit to which a bias control current is to be coupled. The bias current is generated through a feedback loop from a fast photo diode (as opposed to the integrating slow photo diode of the prior art) that receives the emitted optical output pulses from the rear facet of the ILD and produces a unipolar signal current to be applied to a wideband current-to-voltage converter (a resistor), coupled to a reference amplifier, the output of which feeds a lowpass filter to remove the pulse signal component. The output of the lowpass filter is a DC voltage level which is porportional to the average optical output of the ILD. The voltage level output of the lowpass filter is coupled through a current sink to the ILD. The bias current for the ILD is controlled to null the difference between the feedback voltage produced by the feedback photocurrent and a reference voltage. Because the bias current control feedback loop is responsive to the optical output of the ILD, the bias current is automatically compensated for changes in temperature.

The current-to-voltage converter output is further coupled to a buffer amplifier to supply an output voltage to downlink signal quality monitoring circuitry. In a repeatered, multichannel fiber optic communication system, the quality-indication signal availability facilitates a fault isolation scheme wherein the transmitter outputs are examined selectively. In a regenerator unit, the operation and signal degradation thruput of the regenerator as a whole can be tested simply by the measuring of the bit error rate of the optical data pulses transmitted from the output of the regenerator. In the fault isolation procedure described in the above-referenced copending application, a prescribed signal sequence is injected at one end of a fiber optic link and the thruput bit error rate of each transmitter along the link is tested along the link until an unacceptable change is noted, thereby isolating the fault. At the downstream end of the link the unacceptable bit error rate that has been introduced somewhere uplink is observed in the receiver that terminates the link. By having available to it separate signals exclusive of the optical pulses travelling along the link, a remote fault isolating unit is able to accurately and simply pinpoint the equipment causing the fault. As these separate signals are provided directly from the current-to-voltage converter of the bias current feedback control circuit which accurately mirrors the optical pulse output of the ILD in the unit of interest, the quality of the optical data itself can be measured simply and accurately by remote equipment without in any way affecting the optical data itself.

DETAILED DESCRIPTION

Figure 1:
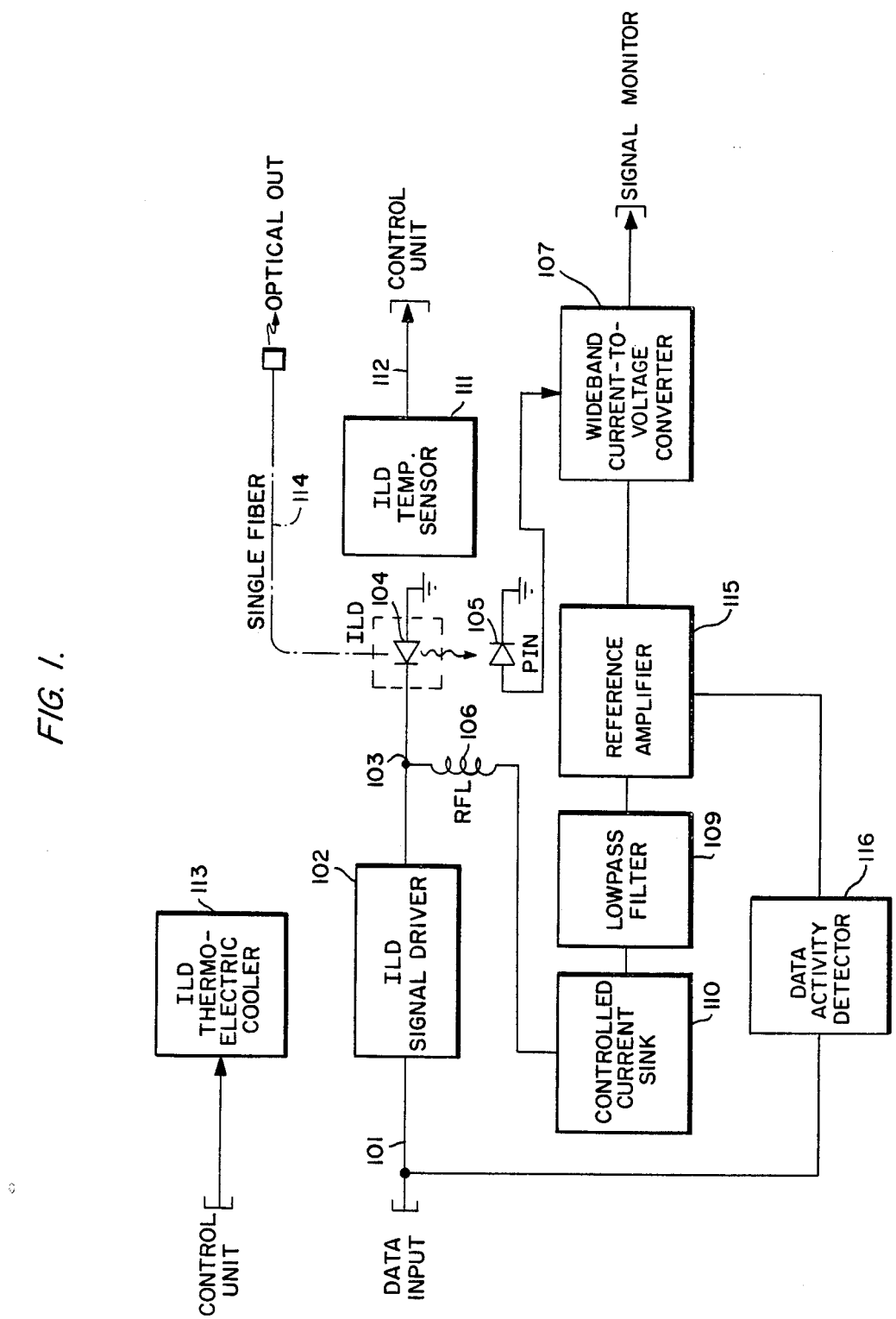
FIG. 1 is a block diagram of the injection laser diode digital transmitter according to the present invention.
Figure 2:
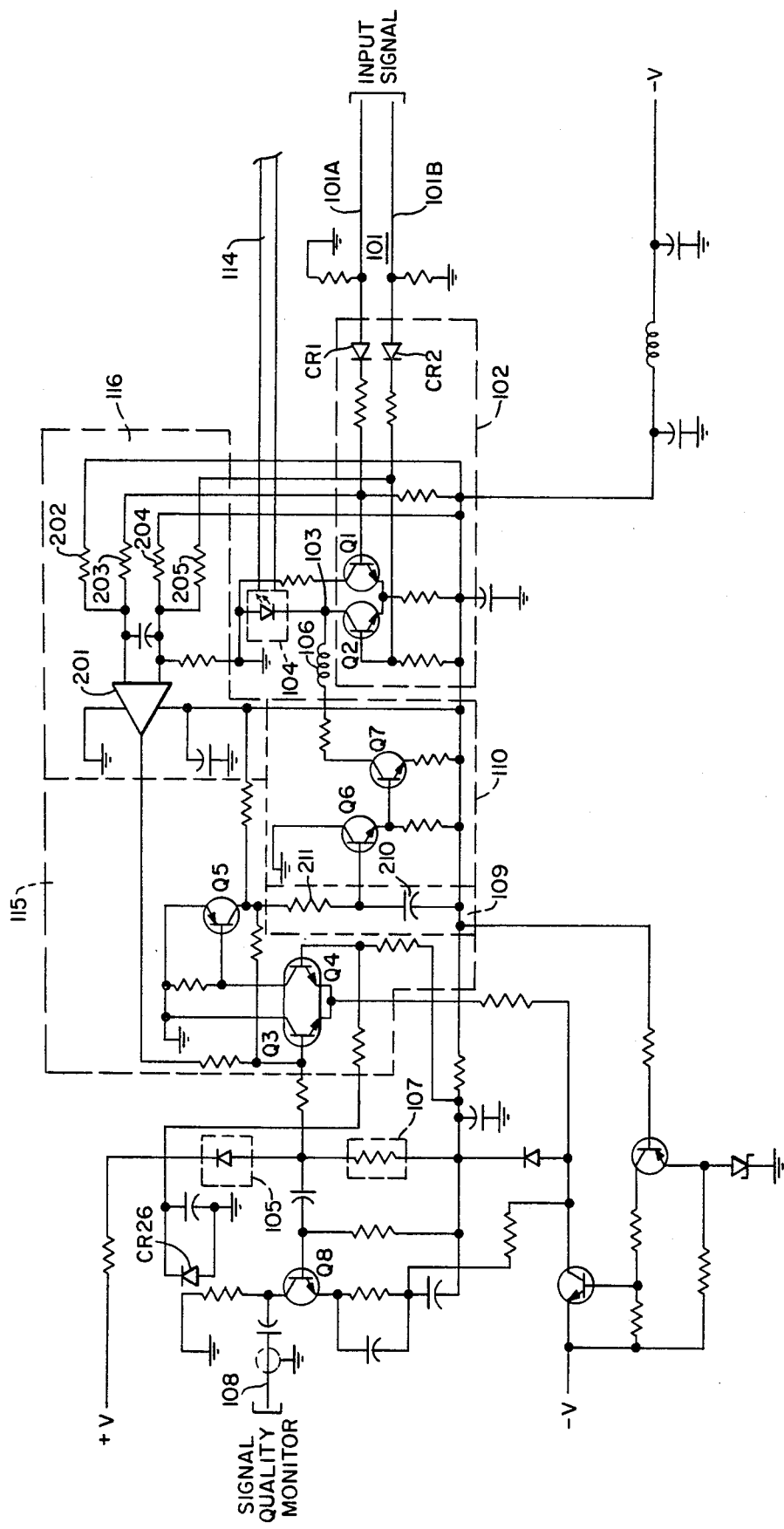
FIG. 2 is a detailed schematic diagram of the ILD transmitter of FIG. 1.

Referring now to FIG. 1 there is shown a block diagram of the injection laser diode digital transmitter which receives an incoming digital data pulse stream (originally provided in the environment of a source terminal or regenerated in the environment of a repeater) on lead 101 and produces in a glass output fiber 114 an optical pulse stream representing the electrical data pulse stream on line 101. Line 101 couples the electrical pulse data stream to a data activity detector 116 and to an injection laser diode driver circuit 102, which may include an emitter-coupled pair of driver transistors, as shown in FIG. 2, to the collector of one of which ILD 104 is connected. The output power vs input driving current of ILD 104 has a knee that causes a threshold in the characteristic, the threshold varying for changes in temperature and due to aging. ILD 104 is biased slightly above this knee threshold providing an acceptable extinction ratio ≧8, for input pulse signals applied on line 101. Data activity detector 116 monitors line 101 for the presence of a data signal and supplies a pseudo photo current to reference amplifier 115 in the event of loss of data signal, as will be described more fully below.

The optical output of ILD 104 into glass fiber 114 is derived from the front facet of the ILD. The optical pulse stream emitted by ILD 104 into glass fiber is stabilized with respect to temperature variations and aging by adjusting the bias current to maintain constant light pulse output power. For this purpose a feedback control arrangement that extracts a bias control current from the optical output of the laser is provided. This feedback control arrangement includes a fast photo diode 105 that is optically coupled to the rear facet of ILD 104 and produces unipolar output photo current corresponding to the signal variation in the optical pulse output. The current generated by photo diode 105 is coupled to a wide band current-to-voltage converter 107 (such as a resistor or transimpedance amplifier) which feeds a reference amplifier (comparator) 115.

Reference amplifier 115 compares the output of current-to-voltage converter 107 with a reference voltage level and supplies the difference to a lowpass filter 109. Reference amplifier 115 also is coupled to the output of a data activity detector 116 which monitors the signal activity of data input line 101. In the presence of signal on line 101 the output of detector 116 is at a low level so that comparator 115 effectively compares the output of converter 107 to a reference level and provides an output to be used for biasing the operational level of ILD 104 on the basis of the average photo output detected by PIN 105. During loss of signal, the output of data activity detector 116 changes in the direction required to provide a pseudo photo current representative signal to comparator 115. This pseudo photo current representative signal effectively deceives comparator 115 so that the bias to ILD 104 is not increased to a level to compensate for loss of optical signal. Namely, for loss of data signal on line 101 there is a drop in the optical output of ILD 104, to a level which improves the laser lifetime and which also prevents overdriving of the device when signal reappears. When the data signal on line 101 reappears, data activity detector 116 removes the pseudo photo current representative signal input to comparator 115, as comparator 115 receives an optical data representative signal from converter 107.

The output of comparator 115 is coupled to lowpass filter 109 which removes any signal component from the voltage output of reference amplifier 115 and supplies a DC voltage level proportional to the average optical output to a current sink 110. From current sink 110 the integrated difference output of comparator 115 is applied through an RF choke 106 to ILD 104 as a bias control current. Comparator 115, filter 109 and current sink 110 operate to adjust the bias current through RF choke 106 and line 103 to reduce the differential between the reference and the output of photo diode 105 to zero. Any fluctuation of the ILD optical output caused by changes in temperature or aging results in a corresponding change in the current produced by photo diode 105 thereby shifting the bias current to again return the differential to zero, thereby maintaining a constant optical output pulse level from ILD 104.

Temperature stability is enhanced by the provision of an ILD thermoelectric cooler element 113, which keeps ILD 104 from exceeding +30° C. in an ambient temperature environment of up to +50° C. ILD cooler 113 may contain a solid state device driven by an external current controlled as a function of temperature. To monitor the ILD temperature, an ILD temperature sensor 111 may be thermally coupled to ILD 104 with line 112 supplying an output indication of temperature, for purposes of cooler control.

A significant feature of the present invention is the coupling of an ILD output monitoring line 108 to current-to-voltage converter 107 for purposes of permitting the quality of the optical pulse signal output of ILD 104 to be observed from a remote location without disturbing the optical link. As described in the above-referenced copending application, the signal quality of a fiber optical channel can be remotely monitored for detecting the occurrence of a fault and for location of the cause of the fault. Advantageously, photo diode 105 should be fairly fast having rise and fall times to accommodate the high data rate signals of interest. For NRZ data rates on the order of 300 Mb/s the $t_r$ and $t_f$ of photo diode 105 may be $\leq$ three nanoseconds, so that from resistor 107 line 108 produces an electrical replica of the optical data pulse stream. This permits the optical pulse stream to be monitored electronically exclusive of the fiber optic data path, thereby facilitating fault detection and isolation from centrallized monitoring and control equipment.

This contrasts significantly to the ILD transmitter configuration of the prior art, referenced above, wherein not only is there no remote monitoring of signal quality by way of an electrical coupling to the feedback control circuit but such a feature cannot be implemented as the feedback photo diode is relatively slow, producing a photo current proportional to the laser diode's peak optical output averaged over the time constant of the photo diode.

Referring next to FIG. 2 there is shown a detailed schematic illustration of the injection laser diode transmitter of the present invention. To simplify the description and illustration labeled broken lined boxes corresponding to the block components of FIG. 1 are shown as surrounding various components in FIG. 2 and only those elements to which a specific reference is made are individually labelled. Input signal line 101 contains a pair of leads 101A, 101B for conducting normal and inverted versions of the electrical data pulse stream to ILD signal driver 102. Signal driver 102 contains a pair of diodes CR1 and CR2 coupling lines 101A and 101B to a pair of emitter-coupled transistors Q1 and Q2. Injection laser diode 104 is connected to the collector output of transistor Q2 and has its front facet optically coupled through a suitable optic fiber connector to a glass fiber 114.

Data activity detector 116 is formed of operational amplifier 201 which is coupled to sum the electrical data pulse signal to be transmitted from the outputs of diodes CR1 and CR2 and a DC voltage level via input resistors 202–205 and supplies a control output to be used for controlling the bias current to ILD 104, as will be explained below. The output of operational amplifier 201 provides a reference input voltage that is coupled to the base of transistor Q3 of another emitter-coupled transistor pair Q3–Q4 configured as a differential amplifier within comparator or reference amplifier 115. The monitored or variable input of differential amplifier pair Q3–Q4 is derived by way of the base of transistor Q3 which is coupled to the output of amplifier 201 and to resistor (current-to-voltage converter) 107 from high speed photo diode 105. Any variation between the input base voltage of transistor Q3 and a reference voltage coupled to the base of transistor Q4 is amplified by a transistor Q5 disposed in the collector output path of transistor Q4 and applied to lowpass filter circuit 109 containing capacitor 210 and resistor 211. Capacitor 210 is coupled to current sink 110 made up of transistors Q6 and Q7. The collector output of transistor Q7 is coupled through RF choke 106 to ILD 104, so that the differential output produced by emitter-coupled transistor pair Q3–Q4 will be amplified by transistor Q5, integrated by lowpass filter 109 and applied through current sink 110 choke 106 to adjust the bias to the ILD 104.

Also coupled to resistor 107 is a buffer transistor Q8 which couples the signal output of photo diode 105 to monitor line 108. Through the buffer transistor Q8 the data pulse signal voltage from resistor 107, proportional to the signal current produced by fast photo diode 105 in response to detecting the optical pulse output from the rear facet of ILD 104, is converted to the appropriate signal level for downstream signal quality monitoring equipment.

As will be appreciated from the foregoing explanation of the invention, the new and improved injection laser diode transmitter feedback arrangement described herein not only effectively stabilizes the operation of the ILD to accommodate fluctuations in temperature and aging, but it also provides a signal coupling scheme that permits external monitoring circuitry to observe the signal emitted by the ILD without the use of a separate optical measuring device that not only complicates the overall optical link configuration but would impact on the optical signal itself by reducing the intensity of the optical signal on the link. The incorporation of a fast photo diode and current-to-voltage converter permits the monitoring circuitry to observe an actual replica of the data, while the lowpass filter feedback from the converter provides the bias current control source with the required average DC voltage level to maintain the stability of the optical output of the ILD.

While we have shown and described one embodiment in accordance with the present invention, it is understood that the same is not limited thereto but is susceptible of numerous changes and modification as known to a person skilled in the art, and we therefore do not wish to be limited to the details shown and described herein but intend to cover all such changes and modifications as are obvious to one of ordinary skill in the art.

What is claimed is:

1. An optical pulse transmitter for generating an optical output data pulse stream representative of an electrical input data pulse stream comprising:
   a light emitting element, responsive to an electrical input data pulse stream applied thereto, for emitting an optical output stream of data pulses; and
   feedback means, optically coupled to the optical data pulse stream emitted by said light emitting elements, for producing an electrical output signal representative of the signal component of said optical data pulse stream emitted by said light emitting element and a bias control signal that is coupled to said light emitting element for stabilizing the optical output of said light emitting element.

2. An optical pulse transmitter according to claim 1, wherein said light emitting element comprises an injection laser diode and said feedback means includes means, responsive to said electrical output signal, for generating a control signal the DC level of which is dependent upon the average optical output power of said injection laser diode.

3. An optical pulse transmitter according to claim 2, wherein said feedback means includes a fast photo detector optically coupled to the optical output of said injection laser diode, for producing said electrical output signal in accordance with the signal components of the optical output data pulse stream emitted by said injection laser diode.

4. An optical pulse transmitter according to claim 3, wherein said feedback means further includes a wideband current-to-voltage converter, coupled to said fast photo detector, for generating an output voltage signal in accordance with the signal component of the optical output pulse stream emitted by said injection laser diode.

5. An optical pulse transmitter according to claim 4, wherein said feedback means further includes lowpass filter means coupled to said wideband current-to-voltage converter, for producing a DC voltage level dependent upon the average optical output of said injection laser diode as contained in the voltage signal produced by said wideband current-to-voltage converter.

6. An optical pulse transmitter according to claim 1, further comprising an electrically controlled temperature cooling element for maintaining the ambient temperature of said light emitting element within a prescribed temperature range.

7. An optical pulse transmitter according to claim 6, wherein said light emitting element comprises an injection laser diode and said feedback means includes means, responsive to said electrical output signal, for generating a control signal the DC level of which is dependent upon the average optical output power of said injection laser diode.

8. An optical pulse transmitter according to claim 2, wherein said feedback means includes means, responsive to the difference between a reference voltage and one of a signal representing the average optical output power of said injection laser diode and a signal representing the average of said electrical input data pulse stream, for generating said bias control voltage.

9. An optical pulse transmitter according to claim 5, wherein said feedback means further includes means, responsive to the difference between a DC voltage reference level and a signal representing the average of said electrical input data pulse stream, for generating said bias control signal.

10. An optical pulse transmitter according to one of claims 5 and 9, further comprising an electrically controlled temperature cooling element for maintaining the ambient temperature of said injection laser diode within a prescribed temperature range.

11. An optical pulse transmitter according to claim 10, further including means for monitoring the ambient temperature of said injection laser diode and producing an output signal indicative thereof.

12. An optical pulse transmitter according to one of claims 1, 2 or 4, further comprising means adapted to couple said electrical output signal to apparatus for monitoring a prescribed characteristic of said optical output data stream through said electrical output signal representative thereof.

13. An optical pulse transmitter according to claim 1, wherein said feedback means includes means, responsive to the difference between a signal representing the optical signal output of said light emitting element and a reference voltage, for producing an output signal representative thereof, and means for integrating said output signal and generating said bias control signal in accordance therewith.

14. An optical pulse transmitter according to claim 13, wherein said integrating means includes a lowpass filter and further including a current sink circuit coupled in series with said lowpass filter and said light emitting element.

15. An optical pulse transmitter according to claim 1, wherein said feedback means includes means, responsive to the difference between a signal representing said electrical input data pulse stream and a reference voltage, for producing an output signal representative thereof, and means for integrating said output signal and generating said bias control signal in accordance therewith.

16. An optical pulse transmitter according to claim 15, wherein said integrating means includes a lowpass filter and further including a current sink circuit coupled in series with said lowpass filter and said light emitting element.

17. An optical pulse transmitter according to claim 1, wherein said feedback means includes
    means for detecting the presence of said electrical input pulse stream and producing an output in response thereto,
    a difference amplifier, a first input of which is coupled to a source of reference potential, and a second input of which is coupled to receive said electrical output signal representative of the signal component of said optical data pulse stream and the output of said detecting means, said difference amplifier having an output, and
    a lowpass filter coupled in series with said difference amplifier and said light emitting element.

18. An optical pulse transmitter according to claim 17, wherein said lowpass filter is coupled to the output of said difference amplifier, and further including a current sink circuit coupled between the output of said lowpass filter and said light emitting element.

19. An injection laser diode transmitter for generating an output data pulse stream representative of an electrical input data pulse stream comprising:
    an injection laser diode, responsive to an electrical input data pulse stream applied thereto, for emitting an optical output stream of data pulses; and
    feedback means, optically coupled to the optical data pulse stream emitted by said injection laser diode, for producing an electrical output signal representative of the signal component of the optical data pulse stream emitted by said injection laser diode and a bias control signal that is coupled to said injection laser diode for stabilizing the optical output of said injection laser diode.

20. An optical pulse transmitter according to claim 19, wherein said feedback means includes means for generating a control signal the DC level of which depends upon the average output power of said injection laser diode.

21. An optical pulse transmitter according to claim 20, wherein said feedback means includes a fast photo detector optically coupled to the optical output of said injection laser diode, for producing said electrical output signal in accordance with the signal component of the optical output data pulse stream emitted by said injection laser diode.

22. An optical pulse transmitter according to claim 21, wherein said feedback means further includes a wideband current-to-voltage converter, coupled to said fast photo detector, for generating an output voltage signal in accordance with the signal component of the optical output pulse stream emitted by said injection laser diode.

23. An optical pulse transmitter according to claim 22, wherein said feedback means further includes lowpass filter means coupled to said wideband current-tovoltage converter, for producing a DC voltage level dependent upon the average optical output of said injection laser diode as contained in the voltage signal produced by said wideband current-to-voltage converter.

24. An optical pulse transmitter according to claim 23, wherein said feedback means further includes means, responsive to the difference between a DC coltage reference level and a signal representing the average of said electrical input data pulse stream, for generating said bias control signal.

25. An optical pulse transmitter according to claim 19, wherein said feedback means includes means, responsive to the difference between a signal representing the optical signal output of said injection laser diode and a reference voltage, for producing an output signal representative thereof, and means for integrating said output signal and generating said bias control signal in accordance therewith.

26. An optical pulse transmitter according to claim 25, wherein said integrating means includes a lowpass filter and further including a current sink circuit coupled in series with said lowpass filter and said injection laser diode.

27. An optical pulse transmitter according to claim 19, wherein said feedback means includes, responsive to the difference between a signal representing said electrical input data pulse stream and a reference voltage, for producing an output signal representative thereof, and means for integrating said output signal and generating said bias control signal in accordance therewith.

28. An optical pulse transmitter according to claim 27, wherein said integrating means includes a lowpass filter and further including a current sink circuit coupled in series with said lowpass filter and said injection laser diode.

29. An optical pulse transmitter according to claim 19, wherein said feedback means includes
   means for detecting the presence of said electrical input pulse stream and producing an output in response thereto,
   a difference amplifier, a first input of which is coupled to a source of reference potential, and a second input of which is coupled to receive said electrical output signal representative of the signal component of said optical data pulse stream and the output of said detecting means, said difference amplifier having an output, and
   a lowpass filter coupled in series with said difference amplifier and said injection laser diode.

30. An optical pulse transmitter according to claim 29, wherein said lowpass filter is coupled to the output of said difference amplifier, and further including a current sink circuit coupled between the output of said lowpass filter and said injection laser diode.

* * * * *